(12) United States Patent
Ko et al.

(10) Patent No.: US 8,687,439 B2
(45) Date of Patent: Apr. 1, 2014

(54) SEMICONDUCTOR APPARATUS AND MEMORY SYSTEM INCLUDING THE SAME

(75) Inventors: Jae Bum Ko, Ichon-si (KR); Jong Chern Lee, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 305 days.

(21) Appl. No.: 13/181,956

(22) Filed: Jul. 13, 2011

(65) Prior Publication Data
US 2012/0176849 A1    Jul. 12, 2012

(30) Foreign Application Priority Data

Jan. 7, 2011 (KR) .................. 10-2011-0001767

(51) Int. Cl.
*G11C 7/00* (2006.01)
(52) U.S. Cl.
USPC .......................................... 365/191
(58) Field of Classification Search
USPC .......................................... 365/191
See application file for complete search history.

(56) References Cited

U.S. PATENT DOCUMENTS 7,636,274 B2 * 12/2009 Solomon et al. ......... 365/233.13
2010/0269012 A1 * 10/2010 Hazelzet .................. 714/753

FOREIGN PATENT DOCUMENTS

| KR | 1019930020466 A | 10/1993 |
|---|---|---|
| KR | 10-2008-0083796 | 9/2008 |
| KR | 1020090092371 A | 9/2009 |

* cited by examiner

*Primary Examiner* — Hoai V Ho
*Assistant Examiner* — Tri Hoang
(74) *Attorney, Agent, or Firm* — William Park & Associates Patent Ltd.

(57) ABSTRACT

A semiconductor memory apparatus includes one or more semiconductor chips configured to have predetermined capacity and structure; and a signal level control unit configured to control levels of external signals, which are input to the one or more semiconductor chips, in order to realize various capacities and structures using the one or more semiconductor chips.

27 Claims, 6 Drawing Sheets

| Capacity<br>Control<br>Signal | 4Gb SDP | 8Gb DDP | 8Gb SDP | 16Gb DDP |
|---|---|---|---|---|
| Chip Signal<br>(TDBP) | L | H | L | H |
| Double Signal<br>(TDOUBLE) | L | L | H | H |

411a

411b

SEMICONDUCTOR APPARATUS AND MEMORY SYSTEM INCLUDING THE SAME

CROSS-REFERENCES TO RELATED APPLICATION

The present application claims priority under 35 U.S.C. §119(a) to Korean Application No. 10-2011-0001767, filed on Jan. 7, 2011, in the Korean Intellectual Property Office, which is incorporated herein by reference in its entirety as if set forth in full.

BACKGROUND

1. Technical Field

Various embodiments of the present invention relate to a semiconductor apparatuses. In particular, certain embodiments relate to a semiconductor memory apparatus and a memory system including the same.

2. Related Art

A typical memory system includes a memory controller, and a semiconductor memory apparatus such as a dynamic random access memory (DRAM) device. In some systems, a processor also performs functions of a memory controller. A semiconductor memory apparatus is usually arranged on a memory module, and modules are coupled to a memory controller through a memory interface. For example, the memory interface may include a chip select line, an address bus line, a command signal line, and a data bus line.

In such a memory system, the memory controller is mounted on a printed circuit board and the semiconductor memory apparatus is mounted on the memory module. The memory module is coupled to the printed circuit board through a connector.

Such a semiconductor memory apparatus may be a memory array having a cell table. These cells may include capacitors substantially maintaining charges and store one or more data bits based on the configuration of the semiconductor memory apparatus. Furthermore, each semiconductor memory apparatus is referred to as a semiconductor chip in the printed circuit board.

FIGS. 1 and 2 are diagrams illustrating the configuration of a typical memory system. As illustrated in FIGS. 1 and 2, a general memory system 100 may include a memory controller 110 and a semiconductor memory apparatus 120 driven in response to command/address signals from the memory controller 110, and a general memory system 200 may include a memory controller 210 and a semiconductor memory apparatus 220 driven in response to command/address signals from the memory controller 210. The semiconductor memory apparatus 120 and 220 may include two semiconductor chips chip1 and chip2 integrated therein as illustrated in FIG. 1 or one semiconductor chip chip1 integrated therein as illustrated in FIG. 2.

As illustrated in FIG. 1, the semiconductor memory apparatus 120 may include two semiconductor chips chip1 and chip2 with a capacity of 4 Gb to achieve the total capacity of 8 Gb. The configuration as illustrated in FIG. 1 will be referred to as an 8 Gb double die package (DDP). Here, the DDP denotes a semiconductor memory apparatus including two or more semiconductor chips.

As illustrated in FIG. 2, the semiconductor memory apparatus 220 may include one semiconductor chip chip1 with a capacity of 8 Gb which is substantially equal to that of the semiconductor memory apparatus 120 illustrated in FIG. 1. The configuration as illustrated in FIG. 2 will be referred to as an 8 Gb single die package (SDP). Here, the SDP denotes a semiconductor memory apparatus including one semiconductor chip.

As described above, in FIG. 1, the two semiconductor chips chip1 and chip2 with a capacity of 4 Gb are stacked to form the semiconductor memory apparatus 120, resulting in an increase in the capacity of the semiconductor memory apparatus 120 but in the reduction in the integration degree of the memory system 100.

Meanwhile, in FIG. 2, the semiconductor memory apparatus 220 includes one semiconductor chip chip1 with a capacity of 8 Gb, resulting in the improvement of the integration degree of the memory system as compared with FIG. 1. However, since one address buffer for an additional address ADD<16> is provided as well, a separate control circuit for controlling an additional address signal is further necessary, resulting in an increase in the size of the memory system 200.

Therefore, the typical memory systems 100 and 200 should use the semiconductor memory apparatus 120 illustrated in FIG. 1 in order to increase the capacity of a semiconductor memory apparatus while abandoning the integration degree of the memory system, and should use the semiconductor memory apparatus 220 illustrated in FIG. 2 in order to increase the capacity of a semiconductor memory apparatus while satisfying the integration degree of the memory system. Therefore, since the typical memory system should be designed again as the memory system 200 illustrated in FIG. 2 in order to satisfy the integration degree in the state in which the memory system 100 illustrated in FIG. 1 is designed in advance, the time and the manufacturing cost increase.

Furthermore, when the typical memory system includes two or more semiconductor chips integrated therein, since it may not be possible to estimate in advance a semiconductor chip which will operate, current may be unnecessarily consumed.

SUMMARY

Accordingly, there is a need for an improved semiconductor memory apparatus capable of achieving various capacities using a previously designed semiconductor memory apparatus and a memory system including the same.

More specifically, a semiconductor memory apparatus capable of substantially preventing current from being unnecessarily consumed by controlling an address signal and a command signal when two or more semiconductor chips are integrated in the semiconductor memory apparatus, and a memory system including the same are described herein.

To attain the advantages and in accordance with the purposes of the invention, as embodied and broadly described herein, one exemplary aspect of the present invention may provide a semiconductor memory apparatus which includes one or more semiconductor chips configured to have predetermined capacity and structure set; and a signal level control unit configured to control levels of external signals, which are input to the one or more semiconductor chips, in order to realize various capacities and structures using the one or more semiconductor chips.

In another exemplary aspect of the present invention, a semiconductor memory apparatus with constant capacity and structure using one or more semiconductor chips may include a buffer section configured to buffer command and address signals input from an outside in order to generate command and address signals when the one or more semiconductor chips operate; and a signal level control unit configured to control levels of the command and address signals, which are input to the buffer section, in order to control an operation of the buffer section based on capacities and structures to be realized in the semiconductor memory apparatus with the constant capacity and structure.

In still another exemplary aspect of the present invention, a memory system may include: a semiconductor memory apparatus configured to include one or more semiconductor chips and have constant capacity and structure; and a memory controller configured to set and output a control signal based on capacities and structures to be realized in the semiconductor memory apparatus.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
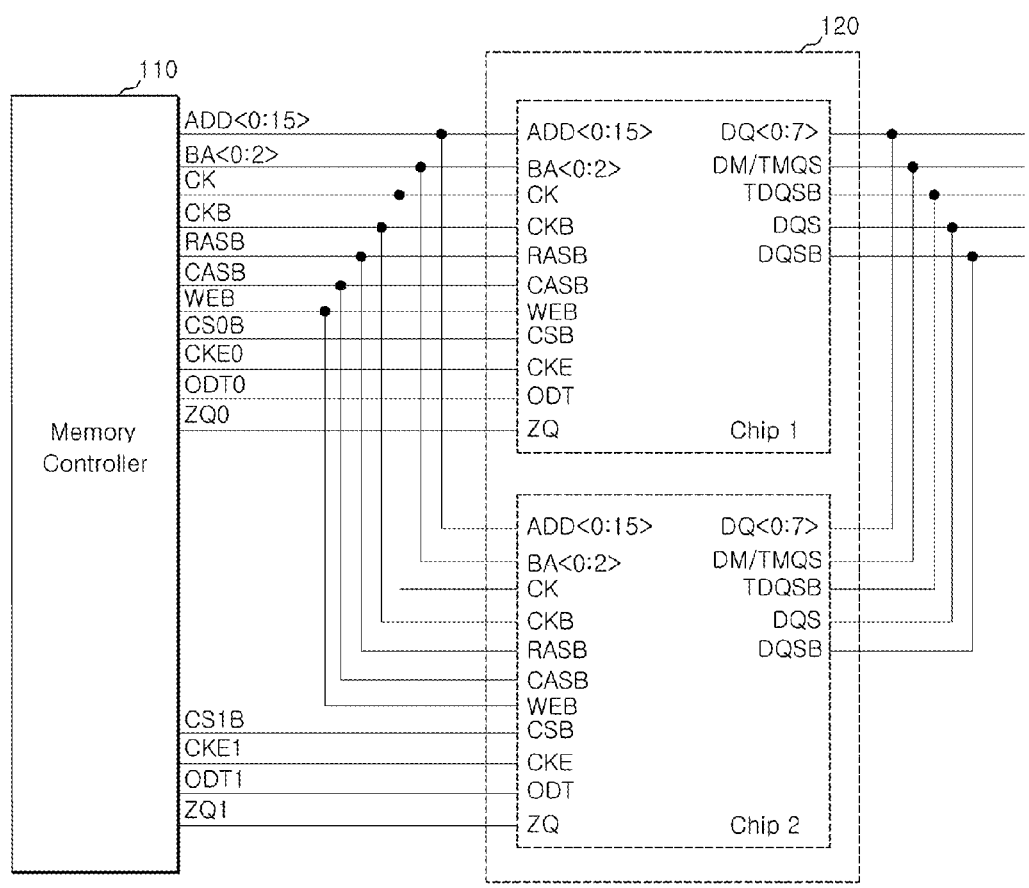
FIGS. 1 and 2 are diagrams illustrating the configuration of a conventional memory system.
Figure 2:
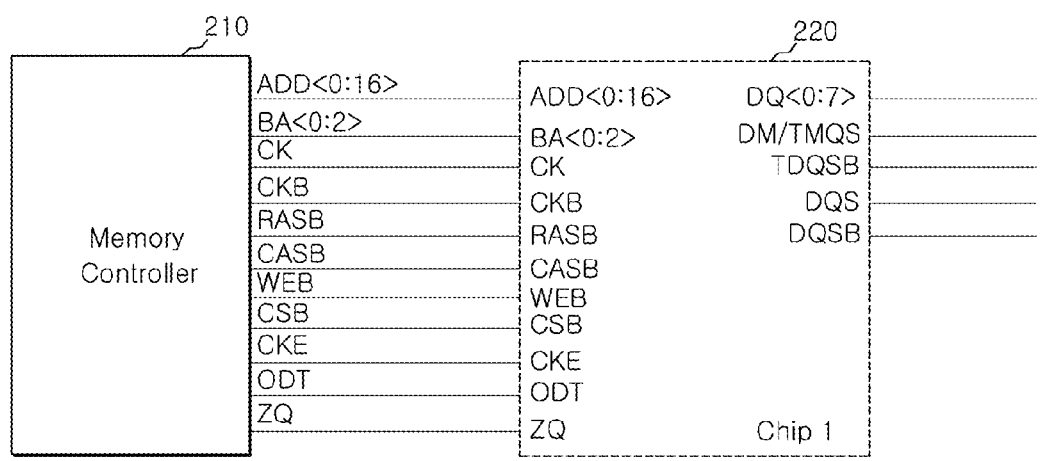

Reference will now be made in detail to the exemplary embodiments consistent with the present disclosure, examples of which are illustrated in the accompanying drawings. Wherever possible, the same reference characters will be used throughout the drawings to refer to the same or like parts.

Figures 3, 4:
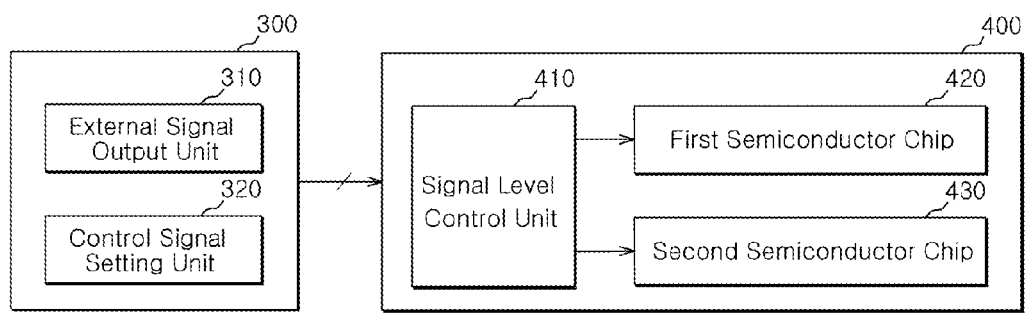
FIG. 3 is a diagram illustrating a memory system according to an embodiment.
FIG. 4 is a diagram illustrating a control signal set by a control signal setting unit of a memory system according to an embodiment.

FIG. 3 is a diagram illustrating a memory system according to an embodiment.

Referring to FIG. 3, a memory system 500 according to the embodiment may include a memory controller 300 and a semiconductor memory apparatus 400.

The memory controller 300 may include an external signal output unit 310 configured to output command/address signals for controlling the operation of the semiconductor memory apparatus 400, and a control signal setting unit 320 configured to set a control signal in advance based on the capacity and structure of a semiconductor memory apparatus to be set by a user in the semiconductor memory apparatus 400 previously designed on a module. For example, in the case where the semiconductor memory apparatus 400 previously designed on the module has a SDP structure including one semiconductor chip with a capacity of 8 Gb, when a user desires a DDP structure including two semiconductor chips with a capacity of 16 Gb, the control signal setting unit 320 sets a control signal for achieving the DDP structure including two semiconductor chips with a capacity of 16 Gb. In the embodiment, the control signal setting unit 320 is provided in the memory controller 300. However, the invention is not limited thereto. For example, the control signal setting unit 320 may also be provided in the semiconductor memory apparatus 400.

The semiconductor memory apparatus 400 may include one or more semiconductor chips (i.e., a first semiconductor chip 420, a second semiconductor chip 430) integrated therein, and a signal level control unit 410 configured to receive the command/address signals and the control signal from the memory controller 300 and output a control signal for controlling the operations of the first semiconductor chip 420 and the second semiconductor chip 430.

The signal level control unit 410 is configured to receive the command/address signals and the control signal, which has been set based on the capacity and structure of the semiconductor memory apparatus 400 to be achieved by a user, from the memory controller 300, and output the received signals to the first semiconductor chip 420 and the second semiconductor chip 430.

The control signal setting unit 320 of the memory system 500 with the above-described structure according to the embodiment will be described in more detail with reference to FIG. 4 below.

FIG. 4 is a diagram illustrating the control signal set by the control signal setting unit of the memory system according to the embodiment.

Referring to FIG. 4, the control signal set by the control signal setting unit 320 of the memory system 500 according to the embodiment is a chip signal TDDR and a double signal TDOUBLE.

The level of the chip signal TDDR is set based on the number of semiconductor chips of the semiconductor memory apparatus 400 to be achieved by a user. That is, when the semiconductor memory apparatus 400 to be implemented has a DDP structure including two or more semiconductor chips, the chip signal TDDR is set to a high level H. When the semiconductor memory apparatus 400 has a SDP structure including one semiconductor chip, the chip signal TDDR is set to a low level L. In this regard, referring to FIG. 4, in the case of a 4 Gb SDP or an 8 Gb SDP, since it has one semiconductor chip, when trying to achieve the 4 Gb SDP or the 8 Gb SDP, the chip signal TDDR is set to the low level L. In the case of an 8 Gb DDP or a 16 Gb DDP, since it has two semiconductor chips, when trying to achieve the 8 Gb DDP or the 16 Gb DDP, the chip signal TDDR is set to the high level H. The 4 Gb, 8 Gb, and 16 Gb are units indicating the capacity of the semiconductor memory apparatus 400.

The level of the double signal TDOUBLE is set based on whether an address pin is added in the semiconductor memory apparatus 400 to be achieved by a user. That is, when the address pin of the semiconductor memory apparatus 400 to be achieved is added, the double signal TDOUBLE is set to the high level H. When the address pin is not added, the double signal TDOUBLE is set to the low level L. In this regard, referring to FIG. 4, in the case of the 4 Gb SDP or the 8 Gb DDP, since the number of the address pins 16 and no address pin is added, the double signal TDOUBLE is set to the low level L. However, in the case of the 8 Gb SDP or the 16 Gb DDP, since the number of the address pins is 17 and an address pin is added, the double signal TDOUBLE is set to the high level H.

The signal level control unit 410, which receives the control signal set by the control signal setting unit 320 and the command/address signals to output the control signal for controlling the operation the semiconductor chip, will be described with reference to FIG. 5 below.

Figure 5:
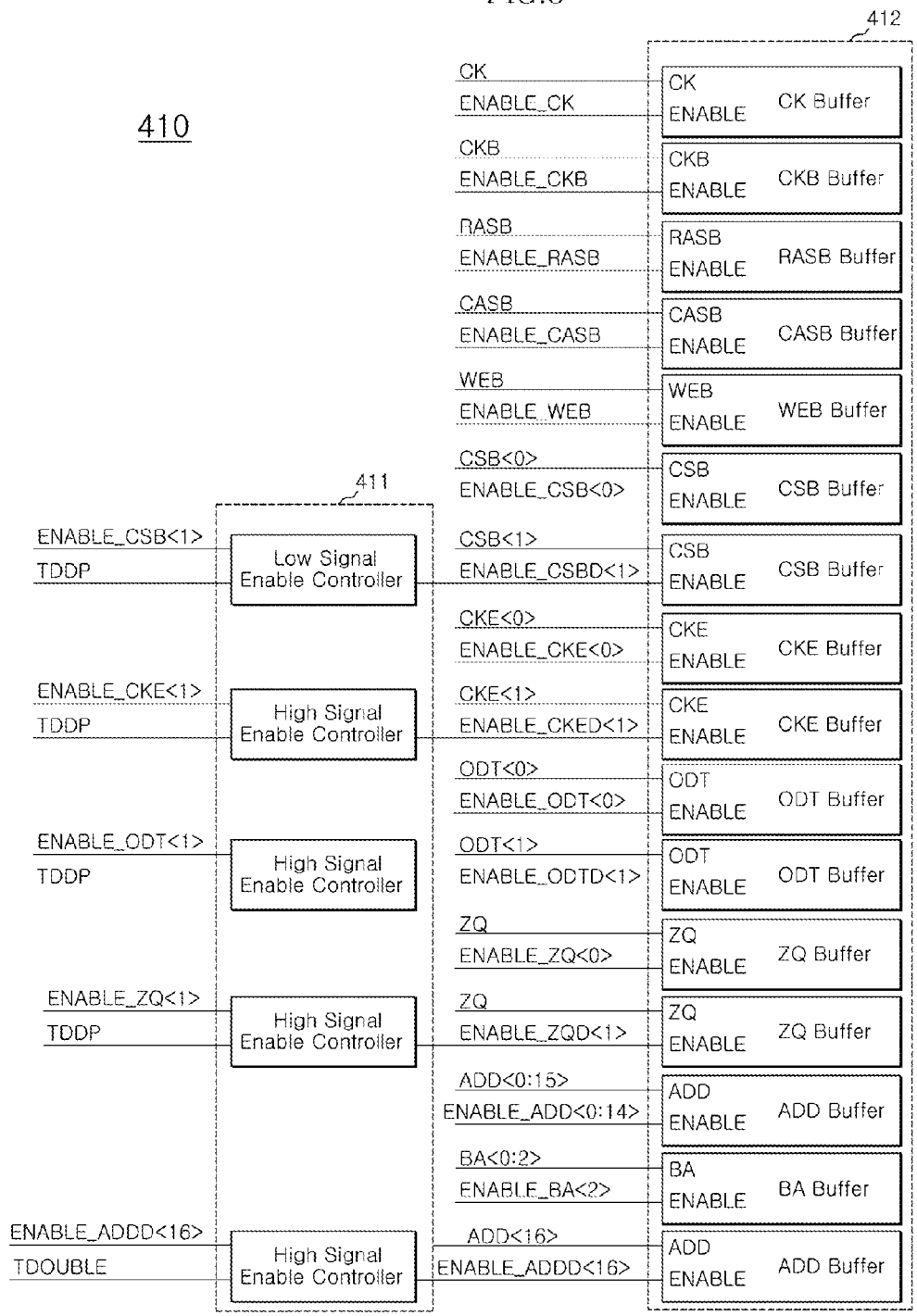
FIG. 5 is a diagram illustrating a signal level control unit of a memory system according to an embodiment.

FIG. 5 is a diagram illustrating the signal level control unit of the memory system according to the embodiment.

Referring to FIG. 5, the signal level control unit 410 of the memory system 500 according to the embodiment includes a signal enable controller 411 and a buffer section 412. The signal enable controller 411 is configured to be provided to lines for command and address signals which are added based on the capacity and structure of the semiconductor memory apparatus 400 to be achieved, and control the activation of the command and address signals. The added command and address signals include command signals added when the semiconductor memory apparatus 400 has the DDP structure, that is, a clock enable signal CKE<1>, impedance command signals ODT<1> and ZQ<1>, and a chip select signal /CS<1>, and an address signal ADD<16> added when the semiconductor memory apparatus 400 has the SDP structure and increases the capacity thereof. The signal enable controller 411 provided to the lines for the signals as described above has different structures based on a signal set to a high level and a signal set to a low level.

The buffer section 412 is configured to buffer the command/address signals CK, /CK, /RAS, /CAS, /WE, /CSB<0>, CKE<0>, ODT<0>, ZQ<0>, ADD<0:15> and BA<0:2>, which are input from the memory controller 300, and signals /CSB<1>, /CKE<1>, ODT<1>, ZQ<1> and ADD<16>, which are input through the signal enable controller 411, and apply the signals to the first semiconductor chip 420 and the second semiconductor chip 430.

The signal enable controller 411 of the signal level control unit 410 configured as above will be described in more detail below.

Figure 6:
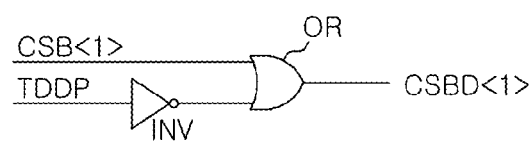
FIG. 6 is a diagram illustrating a low signal enable controller of a memory system according to an embodiment.
Figure 7:
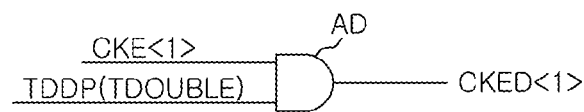
FIG. 7 is a diagram illustrating a high signal enable controller of a memory system according to an embodiment.

FIG. 6 is a diagram illustrating a low signal enable controller of the memory system according to the embodiment, and FIG. 7 is a diagram illustrating a high signal enable controller of the memory system according to the embodiment.

Referring to FIG. 6, a low signal enable controller 411a of the memory system 500 according to the embodiment is a circuit configured to control the chip select signal /CS<1> activated to a low level among signals input from the outside. The low signal enable controller 411a with such a structure includes an inverter INV and an OR gate OR. The inverter INV is configured to invert the chip signal TDDP of the predetermined control signals by the memory controller 300. The OR gate OR is configured to receive the level of the chip signal TDDP inverted by the inverter INV and the level of the chip select signal /CS<1> input from the memory controller 300, and perform an OR operation on the received signals.

Referring to FIG. 7, a low signal enable controller 411b of the memory system 500 according to the embodiment is a circuit configured to control the impedance command signals ODT<1> and ZQ<1>, the clock enable signal CKE<1>, and the additional address signal ADD<16>, which are activated to a high level among the signals input from the outside. The high signal enable controller 411b with such a structure includes an AND gate AD which is configured to receive the level of one of the impedance command signals ODT<1> and ZQ<1>, the clock enable signal CKE<1> and the additional address signal ADD<16> and the level of one of the chip signal TDDP and the double signal TDOUBLE, which are set in advance, and perform an AND operation on the received signals. The AND operation is performed on the impedance command signals ODT<1> and ZQ<1>/the clock enable signal CKE<1> and the level of the chip signal TDDP, and is performed on the additional address signal ADD<16> and the level of the double signal TDOUBLE.

The characteristics when the memory system 500 configured as above according to the embodiment has various capacities will be described with reference to FIG. 8 below.

Figure 8:
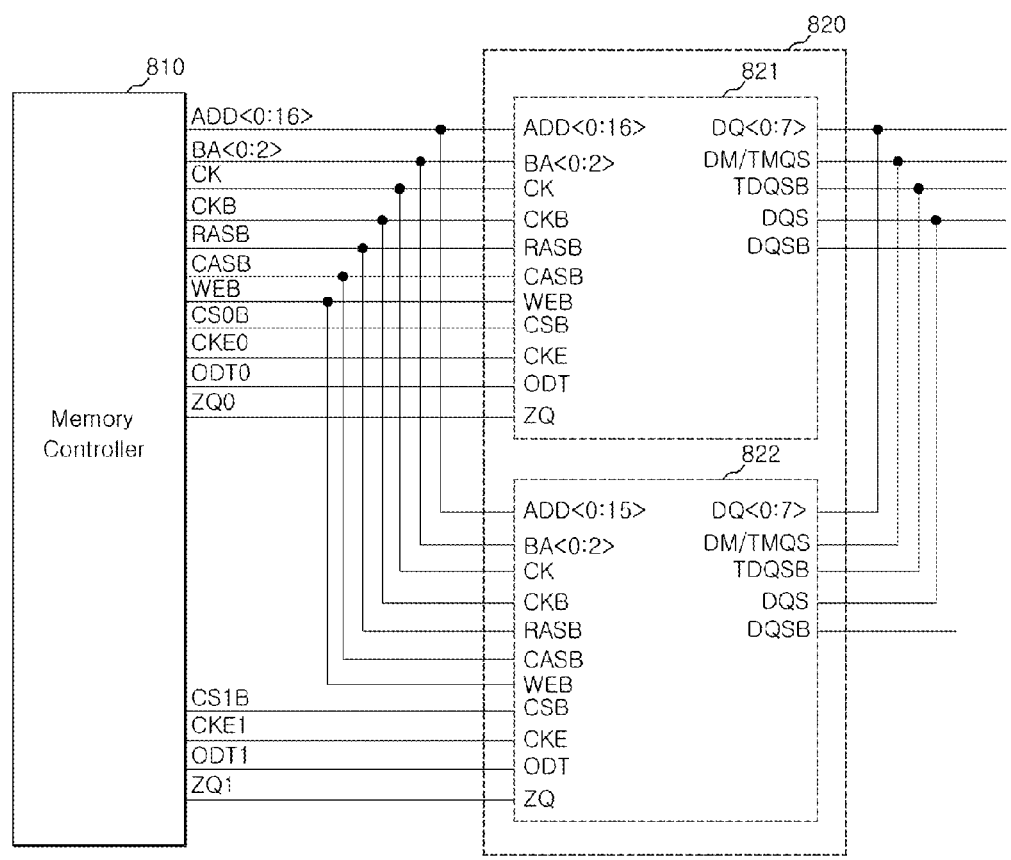
FIG. 8 is a diagram explaining the operation characteristics of a memory system according to an embodiment.

FIG. 8 is a diagram explaining the operation characteristics of the memory system according to the embodiment.

Referring to FIG. 8, the memory system 500 according to the embodiment includes a memory controller 810 and a semiconductor memory apparatus 820 as described above. The semiconductor memory apparatus 820 has a DDP structure in which a first semiconductor chip 821 with a capacity of 4 Gb and a second semiconductor chip 822 with a capacity of 4 Gb are stacked. A signal level control unit of the semiconductor memory apparatus 820 as described above further includes a buffer section for controlling the chip select signal /CS<1>, the clock enable signal CKE<1>, the impedance command signals ODT<1> and ZQ<1>, and the additional address signal ADD<16> due to the DDP structure, as illustrated in FIG. 5.

When realizing a 4 Gb SDP using the semiconductor memory apparatus 820 having the 8 Gb DDP structure, the chip signal TDDP and the double signal TDOUBLE are set to a low level L through the memory controller 300. Then, all external command/address signals input to the first semiconductor chip 821 are activated, but the chip select signal /CS<1>, the clock enable signal CKE<1>, the command signals /CSB<1>, CKE<1>, ODT<1> and ZQ<1>, and the additional address signal ADD<16> are not activated among external command/address signals input to the second semiconductor chip 822. Consequently, it is possible to realize the 4 Gb SDP from the 8 Gb DDP without a change in a design structure.

Then, a method for realizing an 8 Gb SDP using the semiconductor memory apparatus 820 having the 8 Gb DDP structure will be described. The chip signal TDDP is set to a low level L and the double signal TDOUBLE is set to a high level H through the memory controller 300. Then, the external command/address signals and the additional address signal ADD<16> input to the first semiconductor chip 821 are activated, but the chip select signal /CS<1>, the clock enable signal CKE<1>, and the command signals /CSB<1>, CKE<1>, ODT<1> and ZQ<1> are not activated among the external command/address signals input to the second semiconductor chip 822. Consequently, it is possible to realize the 8 Gb SDP from the 8 Gb DDP without a change in a design structure.

Last, a method for realizing a 16 Gb DDP using the semiconductor memory apparatus 820 having the 8 Gb DDP structure will be described. The chip signal TDDP and the double signal TDOUBLE are set to a high level H through the memory controller 300. Then, all the external command/address signals input to the first semiconductor chip 821 and the second semiconductor chip 822 are activated. Consequently, it is possible to realize the 16 Gb DDP from the 8 Gb DDP without a change in a design structure.

As described above, the semiconductor memory apparatus and the memory system including the same according to the embodiment control the levels of input command/address signals based on the capacity and structure of a semiconductor memory apparatus to be realized without a change in the structure of the 8 Gb DDP already designed, thereby realizing various capacities such as a 4 Gb SDP, a 8 Gb SDP, and a 16 Gb DDP, resulting in the reduction in the time and the manufacturing cost.

Furthermore, since the semiconductor memory apparatus and the memory system including the same according to the embodiment control external signals capable of controlling the operation of a semiconductor chip based on the capacity and structure of a semiconductor memory apparatus to be realized, it is possible to estimate a semiconductor chip, which can operate, and substantially prevent a current from flowing through a semiconductor chip, which will not operate, resulting in the reduction in unnecessary power consumption.

While certain embodiments have been described above, it will be understood to those skilled in the art that the embodiments described are by way of example only. Accordingly, the semiconductor memory apparatus and the memory system including the same described herein should not be limited based on the described embodiments. Rather, the semiconductor memory apparatus and the memory system including the same described herein should only be limited in light of the claims that follow when taken in conjunction with the above description and accompanying drawings.

What is claimed is:

1. A semiconductor memory apparatus, comprising:
one or more semiconductor chips configured to have predetermined capacity and structure; and
a signal level control unit configured to control levels of external signals, which are input to the one or more semiconductor chips, in order to realize various capacities and structures using the one or more semiconductor chips; and
a control signal setting unit configured to set a chip signal, which has a level set based on whether the structures to be realized are achieved using the one or more semiconductor chips, and a double signal which has a level set based on whether a number of address pins increases based on the capacities and structures to be realized.

2. The semiconductor memory apparatus according to claim 1, wherein the chip signal is set to a low level when a semiconductor memory apparatus to be realized has a signal die package structure including one semiconductor chip, and is set to a high level when the semiconductor memory apparatus to be realized has a double die package structure including two or more semiconductor chips.

3. The semiconductor memory apparatus according to claim 1, wherein the double signal is set to a high level when the address pins are added based on the capacities and structures to be realized, and is set to a low level when the address pins are not added based on the capacities and structures to be realized.

4. The semiconductor memory apparatus according to claim 1, wherein the signal level control unit comprises:
a signal enable controller configured to receive a control signal set by the control signal setting unit and control the levels of the external signals; and
a buffer section configured to receive and buffer the external signals with the levels controlled by the signal enable controller.

5. The semiconductor memory apparatus according to claim 4, wherein the signal enable controller is configured to be provided to lines for an impedance command signal, a chip select signal, a clock enable signal, and an address signal, which is added based on the capacities and structures to be realized, of the external signals.

6. The semiconductor memory apparatus according to claim 4, wherein the signal enable controller comprises:

a low signal enable controller configured to be provided to a line for a chip select signal of the external signals and control the chip select signal to be output at a low level; and
a high signal enable controller configured to be provided to lines for an impedance command signal, a clock enable signal, and an address signal, which is added based on the capacities and structures to be realized, of the external signals, and control the impedance command signal, the clock enable signal, and the address signal to be output at a high level.

7. The semiconductor memory apparatus according to claim 6, wherein the low signal enable controller comprises:
an inverter configured to receive a chip signal set by the control signal setting unit and invert a level of the chip signal; and
an OR gate configured to receive the chip signal inverted by the inverter and the chip select signal input from an outside and perform an OR operation on the chip signal and the chip select signal.

8. The semiconductor memory apparatus according to claim 6, wherein the high signal enable controller comprising:
a AND gate configured to receive a chip signal set by the control signal setting unit and one of the impedance command signal and the clock enable signal, which are input form an outside, and perform and AND operation on the chip signal and one of the impedance command signal and the clock enable signal.

9. The semiconductor memory apparatus according to claim 6, wherein the high signal enable controller comprises:
an AND gate configured to receive a double signal set by the control signal setting unit and the additional address signal and perform and AND operation on the double signal and the additional address signal.

10. A semiconductor memory apparatus with constant capacity and structure using one or more semiconductor chips, the semiconductor memory apparatus comprising:
a buffer section configured to buffer command and address signals input from an outside in order to generate command and address signals when the one or more semiconductor chips operate; and
a signal level control unit configured to control levels of the command and address signals, which are input to the buffer section, in order to control an operation of the buffer section according to capacities and structures to be realized in the semiconductor memory apparatus with the constant capacity and structure; and
a control signal setting unit configured to set a chip signal, which has a level set based on whether the structures to be realized are achieved using one semiconductor chip, and a double signal which has a level set based on whether a number of address pins of a semiconductor memory apparatus to be realized increases.

11. The semiconductor memory apparatus according to claim 10, wherein the chip signal is set to low level when the semiconductor memory apparatus to be realized has a single die package structure including one semiconductor chip, and is set to a high level when the semiconductor memory apparatus to be realized has a double die package structure including two or more semiconductor chips.

12. The semiconductor memory apparatus according to claim 10, wherein the double signal is set to a high level when the address pins of the semiconductor memory apparatus to be realized are added, and is set to a low level when the address pins of the semiconductor memory apparatus to be realized are not added.

13. The semiconductor memory apparatus according to claim 10, wherein the signal level control unit is configured to be provided to lines for an impedance command signal, a chip select signal, a clock enable signal, and an address signal, which is added based on the capacities and structures to be realized, of the command signals input from the outside.

14. The semiconductor memory apparatus according to claim 10, wherein the signal level control unit comprises:
   a low signal enable controller configured to be provided to a line for a chip select signal of the external signals and control the chip select signal to be output at a low level; and
   a high signal enable controller configured to be provided to lines for an impedance command signal, a clock enable signal, and an address signal, which is added based on the capacities and structures to be realized, of the external signals, and control the impedance command signal, the clock enable signal, and the address signal to be output at a high level.

15. The semiconductor memory apparatus according to claim 14, wherein the low signal enable controller comprises:
   an inverter configured to receive a chip signal from the control signal setting unit and invert a level of the chip signal; and
   an OR gate configured to receive the chip signal inverted by the inverter and the chip select signal input from an outside and perform an OR operation on the chip signal and the chip select signal.

16. The semiconductor memory apparatus according to claim 14, wherein the high signal enable controller comprises:
   an AND gate configured to receive a chip signal input from the control signal setting unit and one of the impedance command signal and the clock enable signal, which are input from an outside, and perform an AND operation on the chip signal and one of the impedance command signal and the clock enable signal.

17. The semiconductor memory apparatus according to claim 14, wherein the high signal enable controller comprises:
   an AND gate configured to receive a double signal input from the control signal setting unit and the additional address signal and perform an AND operation on the double signal and the additional address signal.

18. A memory system comprising:
   a semiconductor memory apparatus configured to include one or more semiconductor chips and have constant capacity and structure; and
   a memory controller configured to set a chip signal, which has a level set based on whether the structures to be realized are achieved using one semiconductor chip, and a double signal which has a level set based on whether a number of address pins of a semiconductor memory apparatus to be realized increases.

19. The memory system according to claim 18, wherein the chip signal is set to a low level when the semiconductor memory apparatus to be realized has a single die package structure including one semiconductor chip, and is set to a high level when the semiconductor memory apparatus to be realized has a double die package structure including two or more semiconductor chips.

20. The memory system according to claim 18, wherein the double signal is set to a high level when the address pins of the semiconductor memory apparatus to be realized are added, and is set to a low level when the address pins of the semiconductor memory apparatus to be realized are not added.

21. The memory system according to claim 18, wherein the semiconductor memory apparatus further comprises:
   a signal level control unit configured to receive command and address signals output from an external signal output unit of the memory controller when the one or more semiconductor chips operate, and control levels of the command and address signals based on the capacities and structures to be realized.

22. The semiconductor memory apparatus according to claim 21, wherein the signal level control unit comprises:
   a signal enable controller configured to receive the control signal set by the memory controller and control levels of external signals; and
   a buffer section configured to receive and buffer the external signals with the levels controlled by the signal enable controller.

23. The semiconductor memory apparatus according to claim 22, wherein the signal enable controller is configured to be provided to lines for an impedance command signal, a chip select signal, a clock enable signal, and an address signal, which is added based on the capacities and structures to be realized, of the external signals.

24. The semiconductor memory apparatus according to claim 22, wherein the signal enable controller comprises:
   a low signal enable controller configured to be provided to a line for a chip select signal of the external signals and control the chip select signal to be output at a low level; and
   a high signal enable controller configured to be provided to lines for an impedance command signal, a clock enable signal, and an address signal, which is added based on the capacities and structures to be realized, of the external signals, and control the impedance command signal, the clock enable signal, and the address signal to be output at a high level.

25. The semiconductor memory apparatus according to claim 24, wherein the low signal enable controller comprises:
   an inverter configured to receive a chip signal set by the control signal setting unit and invert a level of the chip signal; and
   an OR gate configured to receive the chip signal inverted by the inverter and the chip select signal input from an outside and perform an OR operation on the chip signal and the chip select signal.

26. The semiconductor memory apparatus according to claim 24, wherein the high signal enable controller comprises:
   an AND gate configured to receive a chip signal set by the control signal setting unit and one of the impedance command signal and the clock enable signal, which are input from an outside, and perform an AND operation on the chip signal and one of the impedance command signal and the clock enable signal.

27. The semiconductor memory apparatus according to claim 24, wherein the high signal enable controller comprises:
   an AND gate configured to receive a double signal set by the control signal setting unit and the additional address signal and perform an AND operation on the double signal and the additional address signal.

* * * * *